United States Patent
Umemoto et al.

(10) Patent No.: US 7,205,254 B2
(45) Date of Patent: Apr. 17, 2007

(54) DIELECTRIC CERAMIC COMPOSITION AND MULTILAYER CERAMIC PART

(75) Inventors: Takashi Umemoto, Hirakata (JP); Hiroshi Nonoue, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 14 days.

(21) Appl. No.: 11/167,094

(22) Filed: Jun. 28, 2005

(65) Prior Publication Data
US 2005/0288173 A1    Dec. 29, 2005

(30) Foreign Application Priority Data
Jun. 28, 2004 (JP) .............................. 2004-189324
May 25, 2005 (JP) .............................. 2005-152775

(51) Int. Cl.
*C04B 35/465* (2006.01)
(52) U.S. Cl. .................................................. 501/136
(58) Field of Classification Search ................. 501/136
See application file for complete search history.

(56) References Cited

U.S. PATENT DOCUMENTS

| | | | |
|---|---|---|---|
| 6,385,035 B1 * | 5/2002 | Matoba et al. ........... 361/321.1 |
| 6,559,084 B1 | 5/2003 | Fujikawa et al. |
| 6,800,577 B2 * | 10/2004 | Mailadil et al. ............ 501/136 |
| 6,846,767 B2 * | 1/2005 | Kim et al. ................... 501/136 |
| 2005/0209090 A1 * | 9/2005 | Umemoto et al. ........... 501/136 |
| 2005/0215418 A1 * | 9/2005 | Umemoto et al. ........... 501/136 |
| 2005/0288172 A1 * | 12/2005 | Umemoto et al. ........... 501/136 |

FOREIGN PATENT DOCUMENTS

| | | |
|---|---|---|
| JP | 5-211007 | 8/1993 |
| JP | 2001-31467 A | 2/2001 |
| JP | 2003-146742 A | 5/2003 |

* cited by examiner

*Primary Examiner*—Karl Group
(74) *Attorney, Agent, or Firm*—McDermott Will & Emery LLP

(57) ABSTRACT

A dielectric ceramic composition containing a dielectric component represented by the compositional formula $a.Li_2O-b.(CaO_{1-x}-SrO_x)-c.R_2O_3-d.TiO_2$ (wherein x satisfies $0 \leq x < 1$; R is at least one selected from rare-earth elements; and a, b, c and d satisfy $0 \leq a \leq 20$ mol %, $0 \leq b \leq 45$ mol %, $0 < c \leq 20$ mol %, $40 \leq d \leq 80$ mol % and $a+b+c+d=100$ mol %). The composition, after being fired, shows the presence of a main phase having a perovskite structure and an acicular phase containing a rare-earth element.

8 Claims, 3 Drawing Sheets

F I G. 5
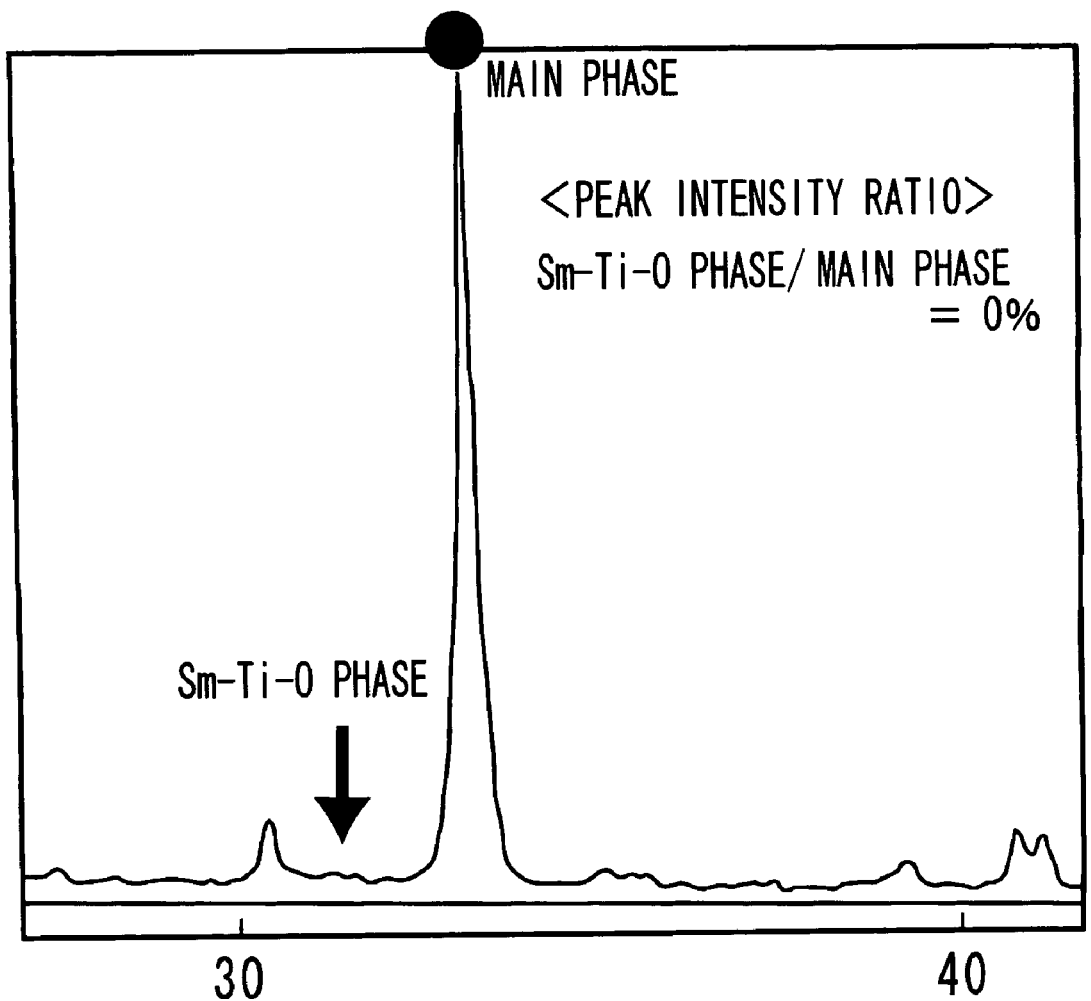

DIELECTRIC CERAMIC COMPOSITION AND MULTILAYER CERAMIC PART

The priority Japanese Patent Application Numbers 2004-189324 and 2005-152775 upon which this patent application is based is hereby incorporated by reference.

BACKGROUND OF THE INVENTION

1. Field of the Invention

The present invention relates to a dielectric ceramic composition for use in multilayer ceramic parts and the like, a method for manufacture thereof and a multilayer ceramic part using the composition.

2. Description of Related Art

With the recent reduction in size and thickness of electronic parts, there is an increasing need for multilayer ceramic parts. A typical multilayer ceramic part includes, in each layer thereof, an inductor or capacitor circuit formed by using a low-temperature co-fired ceramic (LTCC) which is co-firable with a conductive material such as Ag. Generally, a dielectric ceramic composition containing alumina or other ceramic filler and a glass is used as the low-temperature co-fired material for use in multilayer ceramic parts. However, such a composition has a low dielectric constant of 10 or below and, when applied to an LC filter, shows insufficient dielectric characteristics.

In order for a dielectric ceramic composition to be applicable to an LC filter, it must exhibit a high dielectric constant, a low dielectric loss and a temperature coefficient $\tau f$ of approximately 0. As a composition which meets such characteristics, a dielectric ceramic composition having a composition of $Li_2O$—$CaO$—$Sm_2O_3$—$TiO_2$ is disclosed in Japanese Patent Laying-Open No. Hei 5-211007.

Also, Japanese Patent Laying-Open No. 2003-146742 discloses a dielectric ceramic composition containing $(Li_{0.5}(Nd, Sm)_{0.5})TiO_3$—$(Ca_{1-x}Nd_{2x/3})TiO_3$ and 3–15% by weight of a $ZnO$—$B_2O_3$—$SiO_2$ based glass frit or an $Li_2O$—$B_2O_3$—$SiO_2$ based glass frit.

However, the dielectric ceramic composition disclosed in Japanese Patent Laying-Open No. Hei 5-211007 is fired at a high temperature of about 1,300° C. and its original composition has made it difficult to be applied to multilayer ceramic parts which require firing at a low temperature of about 900° C.

Also, the dielectric ceramic composition disclosed in Japanese Patent Laying-Open No. 2003-146742 needs to increase its glass loading in order to improve sinterability at a low temperature of about 900° C. The increased glass loading however results in deterioration of dielectric characteristics, which has been a problem.

SUMMARY OF THE INVENTION

It is an object of the present invention to provide a dielectric ceramic composition which can be sintered even at a low temperature of 1,000° C. or below and shows good dielectric characteristics, as well as providing a multilayer ceramic part using the composition.

The present invention provides a dielectric ceramic composition containing a dielectric component represented by the compositional formula $a.Li_2O$-$b.(CaO_{1-x}$—$SrO_x)$-$c.R_2O_3$-$d.TiO_2$ (wherein x satisfies $0 \leq x < 1$; R is at least one selected from rare-earth elements; and a, b, c and d satisfy $0 \leq a \leq 20$ mol %, $0 \leq b \leq 45$ mol %, $0 < c \leq 20$ mol %, $40 \leq d \leq 80$ mol % and a+b+c +d=100 mol %). Characteristically, the dielectric component after being fired shows the presence of a main phase having a perovskite structure and an acicular phase containing a rare-earth element.

Due to the inclusion of the dielectric component having the above compositional formula and also to the presence of the main phase having a perovskite structure and the acicular phase containing a rare-earth element after fired, the dielectric ceramic composition in accordance with the present invention shows a low dielectric loss.

In the present invention, the inclusion of the acicular phases leads to location of more acicular phases along grain boundaries of the main phases. Accordingly, the main phases are more densely sintered together, compared to the case where the acicular phases do not exist but the other phases do. Also, those main phases in the sintered body exist more closely to each other, with the acicular phases located therebetween. Such a dense and uniform condition of the sintered body is believed to lower its dielectric loss and improve its Qf value.

In the present invention, the acicular phase refers to a phase having an aspect ratio (major diameter/minor diameter) of at least 5 and a major diameter of at least 2 µm when a section of the dielectric ceramic composition was observed with a reflection electron image.

The dielectric component in the present invention is represented by the compositional formula $a.Li_2O$-$b.(CaO_{1-x}$—$SrO_x)$-$c.R_2O_3$-$d.TiO_2$ (wherein x satisfies $0 \leq x < 1$; R is at least one selected from rare-earth elements; and a, b, c and d satisfy $0 \leq a \leq 20$ mol %, $0 \leq b \leq 45$ mol %, $0 < c \leq 20$ mol %, $40 \leq d \leq 80$ mol % and a+b+c+d=100 mol %). In the compositional formula, R represents a rare-earth element. The rare-earth element encompasses La and Y. The dielectric component in the present invention is not particularly specified, so long as it is represented by the above compositional formula. For example, those described in Japanese Patent Laying-Open No. Hei 5-211007 can be favorably used.

In the present invention, the dielectric component is prepared by calcining a raw material. A calcining temperature is preferably at least 1,000° C., more preferably within the range of 1,100–1,300° C. A calcining time is preferably 1–10 hours. The method used to mix the raw material is not particularly specified. A wet mixing method using a ball mill and alcohol may preferably be utilized. After being calcined, the raw material may preferably be ground by a wet grinding method which also uses a ball mill and alcohol.

The main phase having a perovskite structure and the acicular phase containing a rare-earth element exist in the dielectric ceramic composition of the present invention after being fired. Preferably, the acicular phase further contains Ti. Also preferably, the acicular phase contains a higher proportion of rare-earth element than the main phase.

Preferably, the dielectric ceramic composition of the present invention is obtained by firing a mixture of the above-described dielectric component and a glass component. More preferably, such a mixture is ground intensely in a bead mill using alcohol as a solvent before it is fired. Grinding in a bead mill makes it easier to obtain the dielectric ceramic composition having an acicular phase in accordance with the present invention.

The firing temperature is preferably not higher than 1,000° C., more preferably within the range of 850–950° C.

The glass component preferably contains at least a bismuth glass. The bismuth glass containing 30–80% by weight of $Bi_2O_3$ is preferably used.

In the dielectric ceramic composition of the present invention, the glass component is preferably contained in the amount of 1–10% by weight. The smaller amount of the glass component may increase the difficulty of low-temperature firing. The larger amount of the glass component decreases the relative amount of the dielectric component, resulting in deterioration of dielectric characteristics.

The dielectric ceramic composition of the present invention, when fired, shows good sinterability. After the firing, it preferably exhibits a mean pore size of not greater than 0.1 µm in a pore size distribution by a mercury penetration method.

In the dielectric ceramic composition of the present invention, an X-ray diffraction peak intensity of a phase (hereinafter referred to as "second phase") containing a rare-earth element, different in type from that in the acicular phase, is preferably not greater than 20%, more preferably not greater than 10%, of a peak intensity of the main phase having a perovskite structure. The second phase appears around 31.4.degree. in the X-ray diffraction pattern (CuKr) and has a monoclinic (or similar) crystal structure. If a ratio (second phase/main phase) in peak intensity of the second phase to the main phase does not exceed 20%, the dielectric property of the dielectric ceramic composition is further improved.

The multilayer ceramic part of the present invention is characterized as having a structure wherein a dielectric layer comprising the above-described dielectric ceramic composition of the present invention and a conductive layer are placed above each other.

FIGS. 3 and 4 are a perspective view and an exploded perspective view, respectively, showing the multilayer ceramic part in accordance with the present invention. As shown in FIGS. 3 and 4, a conductive layer 2 is provided on a dielectric layer 1. In a particular embodiment, via holes 3 may be formed in the dielectric layer 1. Such dielectric layers are stacked in a pile to constitute the multilayer ceramic part. Such a multilayer ceramic part can be manufactured, for example, by preparing a slurry of a mixture containing a glass component and a dielectric component which constitute the dielectric ceramic composition of the present invention, rendering the slurry into a sheet, cutting the sheet to a desired size, printing a conductive layer in a desired pattern on the sheet using an Ag paste or the like to provide a dielectric green sheet, arranging such dielectric green sheets in multilayers and press bonding them, and firing the multilayers of dielectric green sheets at a predetermined temperature.

The present invention provides a dielectric ceramic composition and a multilayer ceramic part which can be sintered even at a temperature of not higher than 1,000° C. and exhibits the reduced dielectric loss.

BRIEF DESCRIPTION OF THE DRAWINGS

FIG. 5 is a chart showing an X-ray diffraction pattern of the sample of Example 1 in accordance with the present invention.

DESCRIPTION OF THE PREFERRED EXAMPLES

The present invention is now described in detail with reference to examples. The following examples illustrate the practice of the present invention but are not intended to be limiting thereof. Suitable changes and modifications can be effected without departing from the scope of the present invention.

EXAMPLE 1

$Li_2CO_3$, $CaCO_3$, $SrCO_3$, $Sm_2O_3$ and $TiO_2$ were weighed and mixed so as to result in the following composition; $Li_2O$: 9 mol %, CaO: 15 mol %, SrO: 1 mol %, $Sm_2O_3$: 12 mol %, and $TiO_2$: 63 mol %. This mixture was wet mixed in a ball mill for 24 hours by a wet mixing method using alcohol, and then calcined at 1,200° C. for 5 hours. After calcination, the resulting powder was again ground in a ball mill for 24 hours by a wet grinding method using alcohol.

After the grinding treatment, 1% by weight of a glass A (borosilicate glass, "GA-12" manufactured by Nippon Electric Glass Co., Ltd., softening point: about 560° C.) and 1% by weight of a glass B (bismuth glass, $Bi_2O_3$: 75% by weight, $B_2O_3$: 15% by weight, ZnO: 10% by weight, softening point: about 470° C.) were added to the calcined product. Using alcohol as a solvent, they were dispersively mixed in a bead mill for 4 hours. 0.5 mm diameter zirconia beads were used as the dispersing medium in the bead mill. A slurry obtained as a result of the treatment was dried, granulated with the addition of an organic binder such as polyvinyl alcohol, classified and then pressed under a pressure of 2,000 kg/cm$^2$ into a product having a predetermined size and shape. This product was debindered at 500° C. for 2 hours and then fired at 900° C. for 5 hours.

COMPARATIVE EXAMPLE 1

The procedure of Example 1 was followed, except that the dispersive mixing of the calcined product and the glass was carried out in a ball mill with alcohol as a solvent, instead of using the bead mill, and this treatment in the ball mill was continued for 20 hours, to prepare a sample.

(Section Observation with Reflection Electron Image)

Figure 1:
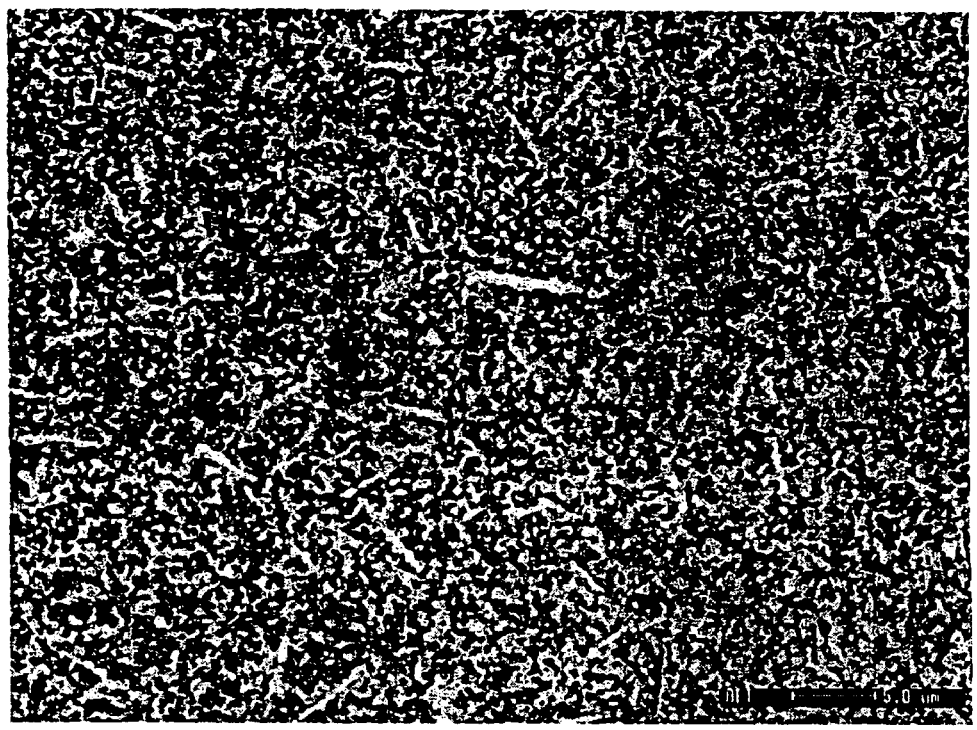
FIG. 1 is a micrograph showing a reflection electron image of a section of the sample of Example 1 in accordance with the present invention.
Figure 2:
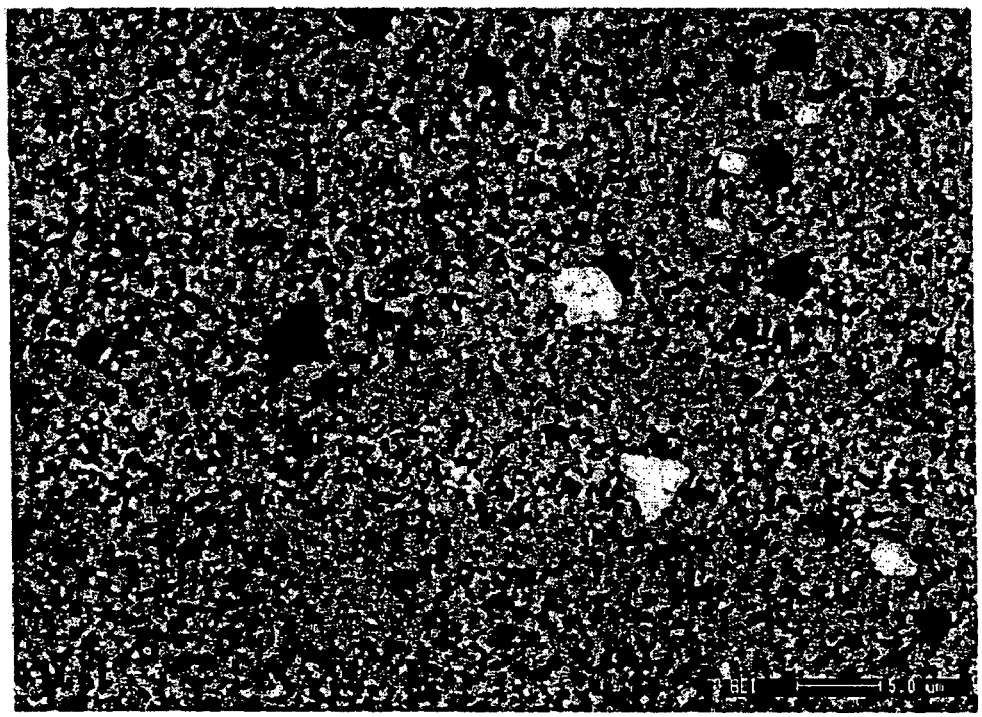
FIG. 2 is a micrograph showing a reflection electron image of a section of the sample of Comparative Example 1.

For each of the above-prepared samples of Example 1 and Comparative Example 1, a reflection electron image of its section was observed. FIG. 1 shows a reflection electron image of a section of the sample obtained in Example 1. FIG. 2 shows a reflection electron image of a section of the sample obtained in Comparative Example 1.

As shown in FIG. 1, dispersion of acicular phases (appearing lightened or white) is confirmed throughout the main phase of the sample of Example 1. EPMA analysis results reveal that the acicular phase is an oxide layer containing Sm and Ti. It is also observed that the particle size is small and uniform over an entire region with few pores.

As contrary to the sample of Example 1 in which the acicular phases are observed, FIG. 2 apparently shows the absence of such acicular phases in the sample of Comparative Example 1. EPMA analysis results reveal that the segregation phases appearing white in FIG. 2 are composed of the same elements as in the acicular phase in the sample of Example 1. The sample of Comparative Example 1 apparently has more pores than the sample shown in FIG. 1.

The acicular phases in FIG. 1 (Example) and the phases appearing white in FIG. 2 (Comparative Example 1) were measured for major and minor diameters to calculate aspect ratios (major diameter/minor diameter) The results are shown in Table 1.

TABLE 1

| | Major Diameter (μm) | Minor Diameter (μm) | Aspect Ratio (Major Diameter/ Minor Diameter) |
|---|---|---|---|
| Example 1 | 3.6 | 0.2 | 16.90 |
| | 2.1 | 0.2 | 10.30 |
| | 4.1 | 0.5 | 7.90 |
| | 3.4 | 0.2 | 16.80 |
| | 2.6 | 0.3 | 10.56 |
| | 6.0 | 1.1 | 5.63 |
| | 2.7 | 0.3 | 10.27 |
| | 7.7 | 0.5 | 15.38 |
| Comparative | 2.7 | 2.2 | 1.19 |
| Example 1 | 1.1 | 0.9 | 1.19 |
| | 2.1 | 1.6 | 1.33 |
| | 1.3 | 1.0 | 1.33 |
| | 2.6 | 1.4 | 1.82 |
| | 2.1 | 0.6 | 3.52 |
| | 4.6 | 2.1 | 2.19 |
| | 3.6 | 0.9 | 4.23 |

The results shown in Table 1 reveal a mean aspect ratio of 11.7 for the acicular phases in Example 1 and a mean aspect ratio of 2.1 for the phases appearing white in Comparative Example 1. It has been accordingly found that the acicular phase in the present invention has an aspect ratio (major diameter/minor diameter) of at least 5 and a major diameter of at least 2 μm.

Because a phase containing a higher proportion of a heavy element generally appears whiter, the acicular phase appearing white in FIG. 1 is found to contain a higher proportion of a rare-earth element.

(Measurement of Mean Pore Size in Pore-Size Distribution by Mercury Penetration Method)

For the samples obtained in Example 1 and Comparative Example 1, a mean pore size in pore-size distribution was measured by a mercury penetration method. A mean pore size was 0.03 μm for the sample of Example 1 and 0.14 μm for the sample of Comparative Example 1. This demonstrates that the sample of Example 1 shows a smaller pore size and a better degree of sinterability when fired.

(Measurement of Shrinkage, Dielectric Constant ϵ and Qf Value)

For each of the samples of Example 1 and Comparative Example 1, its dielectric constant ϵ and Qf value were measured using a dielectric resonator method (Hakki-Coleman method). Its shrinkage during firing was also measured from a dimension of the sample prior to and subsequent to firing. Measurement results for shrinkage, dielectric constant ϵ and Qf value are shown in Table 2.

TABLE 2

| Sample | Shrinkage (%) | Dielectric Constant ϵ | Qf (GHz) | Acicular Phase |
|---|---|---|---|---|
| Example 1 | 14.7 | 72.3 | 2680 | Present |
| Comparative Example 1 | 13.0 | 78.9 | 2236 | Absent |

As can be clearly seen from the results shown in Table 2, the sample of Example 1 shows the slightly lower dielectric constant ϵ, higher Qf value and thus lower dielectric loss, compared to the sample of Comparative Example 1. The sample of Example 1 also shows the higher shrinkage, demonstrating the improved degree of sinterability when fired.

(Measurement of X-Ray Diffraction Pattern)

An X-ray diffraction pattern of the sample of Example 1 was measured. FIG. 5 shows its X-ray diffraction pattern.

As shown in FIG. 5, a sharp peak of a perovskite phase as a main phase appears around 33.1.degree. for the sample of Example 1. In FIG. 5, no peak appears near 31.4.degree. which indicates "Sm—Ti—O phase". This Sm—Ti—O phase is a second phase which contains a rare-earth element and is different from that in the acicular phase. As described earlier, the ratio (Sm—Ti—O phase/main phase) in peak intensity of the second to main phase is preferably not greater than 20% (20/100). In this Example, it is 0%.

The second phase has a monoclinic crystal structure and is represented by the compositional formula $Ca_{1.38}Sm_{3.1}Ti_{0.52}O_{7.07}$.

An X-ray diffraction peak of around 30.3.degree. in FIG. 5 indicates an $Sm_2Ti_2O_7$ phase and presumably corresponds to the acicular phase in the present invention. The ratio ($Sm_2Ti_2O_7$ phase/main phase) in peak intensity of the $Sm_2Ti_2O_7$ phase to the main phase is 8% (8/100).

EXAMPLE 2

Figure 3:
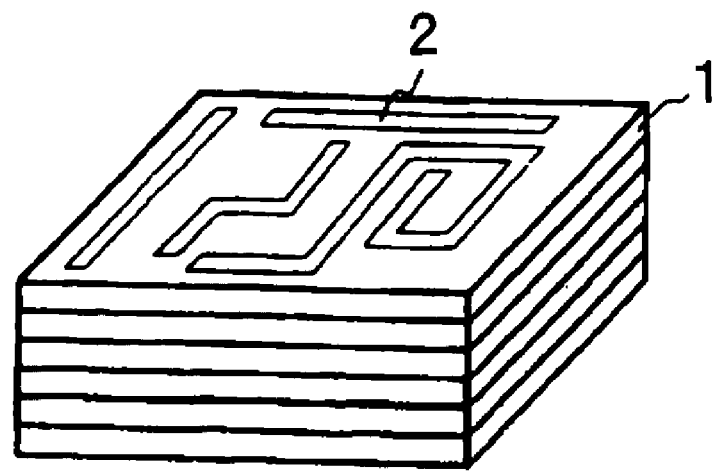
FIG. 3 is a perspective view showing an embodiment of the multilayer ceramic part of the present invention.
Figure 4:
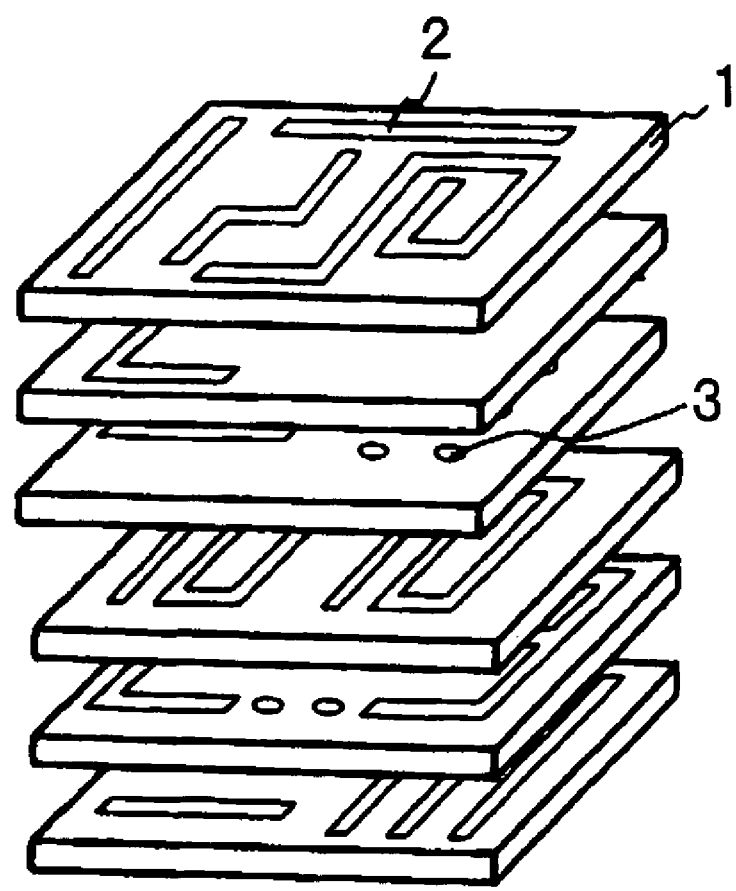
FIG. 4 is an exploded perspective view showing an embodiment of the multilayer ceramic part of the present invention.

As described above, the multilayer ceramic part of the present invention can be obtained by firing multilayers of dielectric green sheets each consisting of a dielectric layer comprising the dielectric ceramic composition of the present invention and a conductive layer formed on a surface of the dielectric layer. For example, a dielectric component is obtained in the same manner as in the preceding Example. A glass component and other additives, if necessary, are added to the dielectric component, followed by mixing in a ball mill. After addition of a polyvinyl butyral (PVB) binder, the resultant is mixed in a ball mill to provide a slurry. The slurry is then formed into a 50–100 μm thick sheet using a doctor blade equipment. The obtained sheet is cut into a desired size. An Ag paste is printed thereon in a desired pattern to provide a dielectric green sheet. 8–20 layers of such green sheets, as shown in FIGS. 3 and 4, are stacked in a pile, bonded compressively, debindered at 400° C. and then fired at 900° C. for 2 hours, resulting in a multilayer ceramic part.

What is claimed is:

1. A dielectric ceramic composition containing a dielectric component represented by the compositional formula $a.Li_2O\text{-}b.(CaO_{1-x}\text{—}SrO_x)\text{-}c.R_2O_3\text{-}d.TiO_2$ (wherein x satisfies $0 \leq x < 1$; R is at least one selected from rare-earth elements; and a, b, c and d satisfy $0 \leq a \leq 20$ mol %, $0 \leq b \leq 45$ mol %, $0 < c \leq 20$ mol %, $40 \leq d \leq 80$ mol % and $a+b+c+d=100$ mol %), wherein said composition, after being fired, shows the presence of a main phase having a perovskite structure and an acicular phase containing a rare-earth element.

2. The dielectric ceramic composition as recited in claim 1, wherein said acicular phase further contains Ti.

3. The dielectric ceramic composition as recited in claim 1, wherein said acicular phase contains a higher proportion of rare-earth element than said main phase.

4. The dielectric ceramic composition as recited in claim 1, wherein said composition is obtained by firing a mixture of said dielectric component and a glass component.

5. The dielectric ceramic composition as recited in claim 4, wherein said glass component contains a bismuth glass.

6. The dielectric ceramic composition as recited in claim 4, wherein said glass component is contained in the amount of 1–10% by weight.

7. A multilayer ceramic part having a structure in which a dielectric layer comprising the dielectric ceramic composition as recited in claim 1 and a conductive layer are placed above each other.

8. A multilayer ceramic part having a structure in which a dielectric layer comprising the dielectric ceramic composition as recited in claim 4 and a conductive layer are placed above each other.

* * * * *